United States Patent [19]
Kaushik et al.

[11] Patent Number: 5,712,177
[45] Date of Patent: Jan. 27, 1998

[54] METHOD FOR FORMING A REVERSE DIELECTRIC STACK

[75] Inventors: Vidya S. Kaushik; Hsing-Huang Tseng, both of Austin, Tex.

[73] Assignee: Motorola, Inc., Schaumburg, Ill.

[21] Appl. No.: 533,496

[22] Filed: Sep. 25, 1995

Related U.S. Application Data

[63] Continuation of Ser. No. 283,361, Aug. 1, 1994, abandoned.

[51] Int. Cl.$^6$ .................... H01L 21/8247; H01L 21/316
[52] U.S. Cl. .................... 437/42; 437/43; 437/239; 437/242
[58] Field of Search .................... 437/42, 43, 235, 437/238, 239, 241, 242, 243, 968, 983, 984, 975, 941; 257/406, 411

[56] References Cited

U.S. PATENT DOCUMENTS

| | | |
|---|---|---|
| 4,179,311 | 12/1979 | Athanas . |
| 4,722,909 | 2/1988 | Parrillo et al. ............... 437/34 |
| 4,745,086 | 5/1988 | Parrillo et al. ............... 437/43 |
| 4,748,133 | 5/1988 | Griswold ...................... 437/43 |
| 4,851,370 | 7/1989 | Doklan et al. ................ 437/239 |
| 5,104,819 | 4/1992 | Preiberger et al. ........... 437/43 |
| 5,189,501 | 2/1993 | Kawamura et al. ........... 257/647 |
| 5,258,333 | 11/1993 | Shappir et al. ............... 437/242 |
| 5,275,960 | 1/1994 | Yamaguchi et al. .......... 437/42 |
| 5,298,447 | 3/1994 | Hong ............................ 437/43 |
| 5,304,829 | 4/1994 | Mori et al. ................... 437/62 |
| 5,319,229 | 6/1994 | Shimoji et al. ............... 437/62 |
| 5,330,924 | 7/1994 | Huang et al. ................. 437/43 |
| 5,330,938 | 7/1994 | Camerlenghi ................ 437/43 |
| 5,362,632 | 11/1994 | Mathews ...................... 437/47 |
| 5,371,026 | 12/1994 | Hayden et al. ............... 437/41 |
| 5,376,593 | 12/1994 | Sanddhu et al. ............. 437/242 |
| 5,393,683 | 2/1995 | Mathews et al. ............. 437/42 |
| 5,407,870 | 4/1995 | Okada et al. ................. 437/42 |
| 5,429,966 | 7/1995 | Wu et al. ...................... 437/43 |
| 5,464,792 | 11/1995 | Tseng et al. .................. 437/160 |
| 5,470,611 | 11/1995 | Yang et al. ................... 437/239 |

FOREIGN PATENT DOCUMENTS

| | | | |
|---|---|---|---|
| 3340583A | 5/1984 | Germany | 437/239 |
| 56-45078 | 4/1981 | Japan | 437/42 |
| 2-66948 | 3/1990 | Japan | 437/92 |
| 2-28250 | 6/1990 | Japan | 437/239 |
| WO8705152 | 8/1987 | WIPO | 437/239 |

OTHER PUBLICATIONS

"A Comparison of CVD Stacked Gate Oxide and Thermal Gate Oxide for 0.5μm Transistors Subjected to Process-Induced Damage," IEEE Trans. on Electron Devices, vol. 40, No. 3, Mar. '93.

Primary Examiner—John Niebling
Assistant Examiner—S. Mulpuri

[57] ABSTRACT

An embodiment of the invention allows the reversing of the sequence of a stacked gate dielectric layer so that a thermal oxide overlies a CVD deposited oxide. A CVD dielectric (12) is first deposited to a desired thickness. Then a layer of silicon (16), either amorphous or polycrystalline, is deposited overlying the CVD dielectric, wherein this silicon layer is approximately one-half of the desired thickness of the final top oxide. The silicon layer is then thermally oxidized to form thermal oxide (18). This method of the invention allows the denser thermal oxide to be formed overlying the less dense CVD dielectric layer as desired to form a reverse dielectric stack.

4 Claims, 3 Drawing Sheets

5,712,177

METHOD FOR FORMING A REVERSE DIELECTRIC STACK

This application is a continuation of prior application Ser. No. 08/283,361, filed Aug. 1, 1994, now abandoned.

CROSS-REFERENCE TO RELATED APPLICATION

Related material is disclosed in a patent application by Bich-Yen Nguyen et al., entitled "Method for Forming Concurrent Top Oxides Using Reoxidized Silicon," filed concurrently herewith and assigned to assignee hereof.

FIELD OF THE INVENTION

The present invention relates generally to a semiconductor device and more specifically to a method for forming semiconductor dielectrics.

BACKGROUND OF THE INVENTION

A stacked gate oxide having two different oxides in the stack is desired for semiconductor device applications to minimize shorting or punch-through problems by creating misalignment in the micro-defects inherent in the oxides. Stacking two different oxides decreases the probability of a direct migration path through the dielectrics to the underlying silicon substrate. Currently, a stacked gate oxide is formed using the following method. First, a thermal oxide is grown on top of a silicon substrate. Then, a chemical vapor deposition (CVD) oxide is deposited overlying the thermal oxide. However, this CVD layer is less dense than the thermal oxide layer. Therefore, an annealing or densification process is required to densify the CVD layer. The annealing is performed at a high temperature, typically 950° C. However, it is not possible to anneal the CVD to achieve the same density as a thermal oxide unless an extremely long annealing time and a high annealing temperature are used. A problem with the long annealing time and high temperature is that the thermal budget of the device acts as a constraint on the annealing process, thus limiting the amount of annealing that can be done. Moreover, a long annealing time is not desired as it is disadvantageous in terms of cycle time. Therefore, the annealed CVD layer remains less dense than the underlying thermal oxide layer.

After the stacked gate oxide is formed, then a polysilicon gate overlying the stacked gate oxide is formed and etched. Some overetching may occur due to the fact that selectivity between polysilicon and silicon dioxide is not 100% so the etchant may remove some of the underlying oxide. Thus, after patterning of polysilicon gate, a polysilicon reoxidation is performed to form thermal oxide to heal the overetching damage at gate edges and to create a polysilicon bird's beak.

The term bird's beak is given to the structure where a thicker silicon dioxide layer transitions to a thinner oxide layer, thus giving the appearance of a bird's beak. It is analogous to a narrowing of the oxide layer. The most common occurrence of the bird's beak is at the field oxide isolation edges where the thick field oxide transitions to the thin gate oxide. When this occurs at the edge of a polysilicon gate where the edge is thicker due to over-oxidation as compared to the middle regions of the polysilicon gate, the structure is referred to as the 'polysilicon bird's beak'. The polysilicon bird's beak is desired to reduce the Miller capacitance around the polysilicon gate edge to enhance the circuit speed. Additionally, the bird's beak reduces the electric field around the gate edge which reduces the band-to-band tunneling problem. However, a large polysilicon bird's beak increases the effective electrical channel length of the device which may adversely impact the device's performance. Furthermore, a large polysilicon bird's beak increases the effective oxide thickness as devices are scaled to sub-quarter-micron technology, thus acting to degrade device performance due to the low current drive associated with thick oxides. Therefore, an optimal and controllable polysilicon bird's beak structure is important to optimize circuit performance.

However, it is not currently possible to reliably control the bird's beak formation with the present technique of forming a stacked gate oxide. The CVD layer is less dense than thermal oxide so oxygen diffuses through the CVD layer during the polysilicon reoxidation step and continues to oxidize the polysilicon gate edges to cause lifting of the bird's beak. Lifting refers to the phenomenon of over-oxidation of the edges of the polysilicon giving the appearance that the gate has 'lifted'.

Another application where a stacking of dielectrics is used is the interpoly dielectric. The current method of forming an oxide/nitride/oxide (ONO) stack involves first growing a thermal oxide over polysilicon. Then a nitride is deposited overlying the thermal oxide. After the nitride is deposited, either the top surface of the nitride is oxidized or an oxide is deposited overlying the nitride. The deposited oxide is a CVD material which is less dense than what is required, so an annealing step must be performed to densify the top oxide.

BRIEF DESCRIPTION OF THE DRAWINGS

The various figures illustrate many of the same or substantially similar elements. Accordingly, same or similar elements are labeled using the same reference numerals in the drawings accompanying the description.

DETAILED DESCRIPTION OF A PREFERRED EMBODIMENT

An embodiment of the invention allows the reversing of the sequence of a stacked gate dielectric layer so that a thermal oxide will overlie a CVD deposited oxide. A layer of silicon is deposited overlying the CVD deposited oxide. The silicon layer is then thermally oxidized to form thermal oxide. This method of the invention allows the denser thermal oxide to be formed overlying the less dense CVD dielectric layer as desired to form a reverse dielectric stack. This reverse dielectric stack structure is not possible with the prior art method even if the CVD layer were deposited prior to the thermal oxidation step as currently done in the art because the thermal oxide formation will still occur at the silicon substrate and CVD layer interface regardless of sequence of CVD deposition. This approach has the following advantages. It retains the benefits of stacking thermal and CVD oxides, and the top thermal oxide made in accordance with the present invention is denser than the top CVD layer used for the conventional stacked oxide structure. Therefore oxygen will diffuse through the top thermal oxide relatively slowly to oxidize the polysilicon gate during the polysilicon gate reoxidation process. This approach thus provides a better control of poly bird's beak.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

Figure 1:
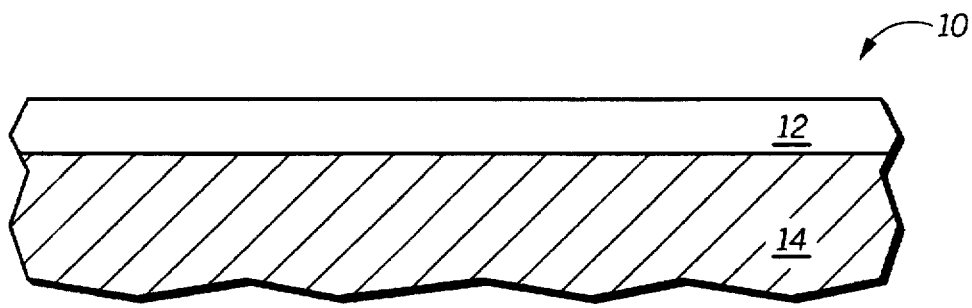
FIGS. 1–4 illustrate, in cross-section, process steps for forming a reverse dielectric stack for a semiconductor device in accordance with an embodiment of the invention.

FIGS. 1–4 illustrate, in cross-section, process steps for forming a reverse dielectric stack 10 for a semiconductor device in accordance with an embodiment of the invention. In FIG. 1 a first dielectric layer 12 is formed overlying a semiconductor substrate 14. The first dielectric layer 12 may be either a nitride, an oxynitride or an oxide. The first dielectric layer 12 may be formed by a CVD method, a process well known in the art, which deposits a layer of material on the top surface of the semiconductor substrate 14. Typically, tetra ethyl orthosilicate (TEOS) is deposited through CVD, although other CVD layers, such as a low temperature oxide (LTO) and a high temperature oxide (HTO) are also commonly used.

The CVD method produces a dielectric layer that is not as dense as a thermal oxide. Thus, if CVD is used to form the first dielectric layer, it may be desirable to perform a densification or annealing process to increase the density of the first dielectric layer 12. Although the thickness of the first dielectric layer 12 is not limited to any particular range, a working range for this thickness is 15 to 100 angstroms (Å), with a preferred range of approximately 15 to 75 Å.

Figure 2:
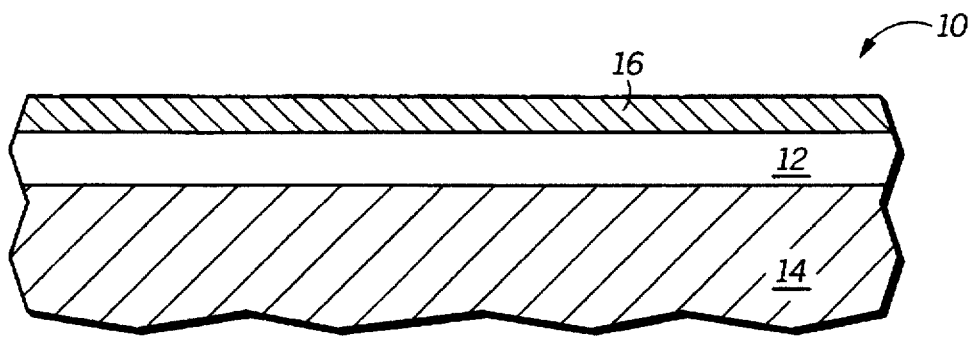

In FIG. 2 a silicon layer 16 is formed overlying the first dielectric layer 12. Silicon layer 16 may be either amorphous or polycrystalline silicon, as long as this silicon layer 16 is of a different crystal structure than the underlying silicon substrate 14. The deposition rate of amorphous silicon is slower than that of polycrystalline silicon, so the thickness may be more easily controlled with amorphous silicon. Additionally, the deposition temperature of amorphous silicon is lower than that of polycrystalline silicon, 500° to 560° C. as compared to 600° to 650° C. The lower deposition temperature is also of advantage because it enables better thickness control than a higher temperature. Furthermore, deposited amorphous silicon generally yields a smoother surface than deposited polycrystalline silicon, so there are some advantages to using amorphous silicon. The thickness of the silicon layer 16 is not limited to any particular range but is preferably in a range of 15 to 150 Å. However, it is important that this thickness is approximately one-half of the desired final thickness of a top dielectric layer. The reason for this requirement will become apparent in subsequent process steps. Thus, depending of the thickness of the first dielectric layer 12, the desired thickness of the top dielectric layer, and the overall thickness desired in the final gate dielectric stack, one would vary the thickness of this deposited silicon layer 16 to the appropriate thickness.

Figure 3:
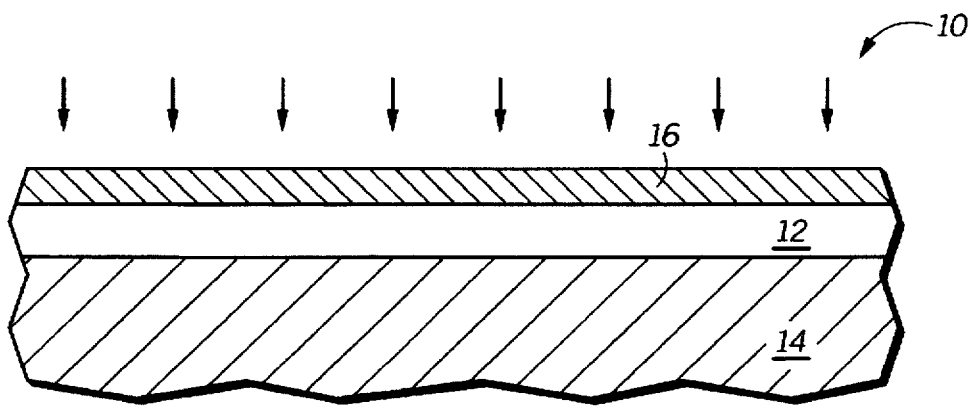

After the silicon layer 16 is formed, then a thermal oxidation step is performed as illustrated in FIG. 3. An oxidizing agent is introduced into the silicon layer 16. This oxidizing agent may be either oxygen ($O_2$) or nitrous oxide ($N_2O$). The thermal oxidation may be performed using either conventional atmospheric pressure equipment or a high pressure oxidation equipment.

Figure 4:
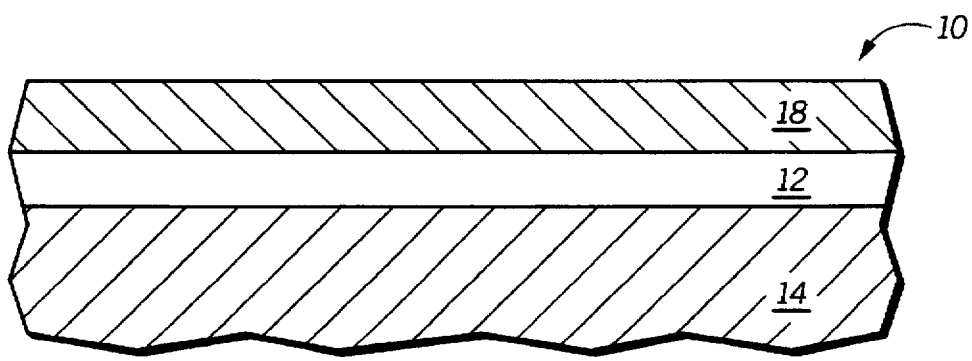

The thermal oxidation step of FIG. 3 produces a reverse dielectric stack 10 as illustrated in FIG. 4. The silicon layer 16 of FIG. 3 has been converted into a second dielectric layer 18 of FIG. 4. In this manner, a reverse dielectric stack may be formed wherein the top dielectric layer is denser than the bottom dielectric layer. It should be noted that the resulting second dielectric layer 18 is approximately twice the thickness of the silicon layer due to the thermal oxidation process once the entire silicon layer is consumed. Thus, if the desired thickness of this second dielectric layer 18 is 100 Å, then the deposited silicon layer should have been approximately 50 Å. Likewise, a desired thickness of 50 Å would be achieved through a deposited silicon thickness of 25 Å.

This reverse dielectric stack 10 has several advantages over the conventional stacked gate oxide structure having a thermal oxide on the bottom of the stack and a CVD layer overlying the bottom thermal oxide. A second advantage is that practicing the invention enables the retention of stacking different dielectrics to maintain the misalignment of micro-defects in the stack to prevent shorting or punch-through problems. Moreover, by being able to form a thermal oxide on the top of the gate dielectric stack, the polysilicon bird's beak profile can be more easily controlled because the oxidizing agent will diffuse much more slowly through a thermal oxide than through a CVD layer due to their different densities. Thus, the bird's beak lifting problem due to the polysilicon reoxidation should be greatly mitigated.

Figure 5:
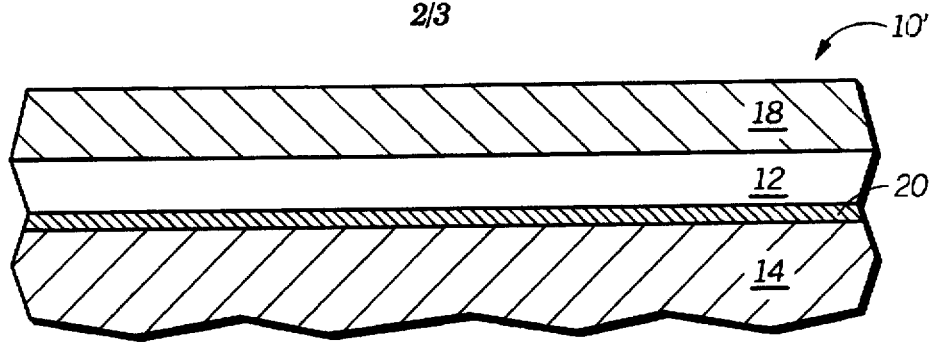
FIGS. 5–6 illustrate, in cross-section, variations of reverse dielectric stacks made in accordance with a method of the invention.

FIG. 5 illustrates a variation on a stacked gate dielectric 10' made in accordance with the invention. While FIG. 4 illustrates an ideal case where the thermal oxidation step is timed such that the oxidant diffuses only through the silicon layer to form the top second dielectric layer 18, in this second embodiment the thermal oxidation process is allowed to continue such that molecules of the oxidizing gas diffuse not only into the silicon layer to convert it into a thermal oxide but also through the first dielectric layer 12 to oxidize a top surface of the underlying semiconductor substrate 14 forming a third dielectric layer 20. This third dielectric layer 20 is also thermal oxide, namely silicon dioxide, which has a denser structure than the first CVD dielectric layer 12. An advantage to this embodiment is that a three-layer dielectric stack can be formed, which introduces yet another misalignment in micro-defects to further reduce the probability of breakdown or shorting of the device. The thickness of this third dielectric can be easily controlled through the oxidation time. A preferred thickness is approximately in a range of 10 to 50 Å.

Figure 6:
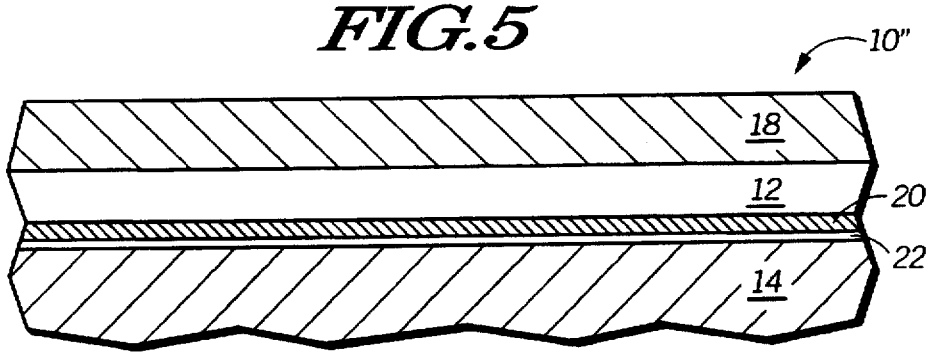

FIG. 6 illustrates yet another variation on a stacked gate dielectric 10" made in accordance with the invention. In this embodiment, the thermal oxidation process has been performed using $N_2O$. As a result of the $N_2O$ oxidant, nitrogen atoms collect at the interface between the silicon substrate 14 and the third dielectric layer, silicon dioxide, 20 to form a thin silicon nitride layer 22, approximately 10 to 20 Å thick. An advantage of this structure is that nitrogen to silicon bonds (Si—N) are stronger than silicon to oxygen (Si—O) bonds to provide a more robust dielectric barrier to prevent punch-through. In addition, the interface state density will be reduced due to the fact that the Si—N bond is less strained than Si—O bond.

Figure 7:
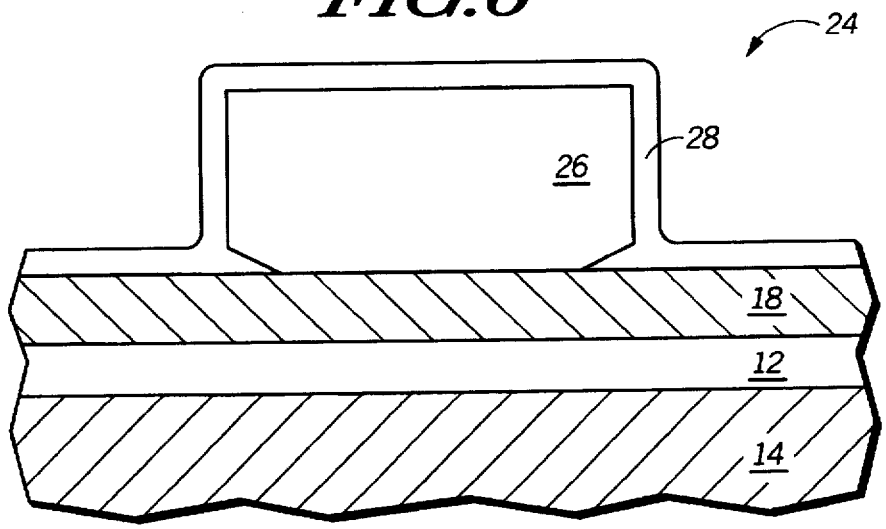
FIG. 7 illustrates, in cross-section, a gate formed overlying the reverse dielectric stack of FIG. 4 to illustrate the bird's beak structure.

FIG. 7 illustrates, in cross-section, a semiconductor device 24 which has a gate 26 overlying the dielectric stack made in accordance with the invention. The gate 26 is typically a polysilicon which has been deposited and etched using known methods. After the gate 26 is formed, a poly reoxidation step is performed to form the outer dielectric layer 28 to heal the damage at the edges of the gate. The poly reoxidation step is typically performed at a relatively low temperature of 850° C., so that further oxidation at the interface of the underlying silicon substrate 14 and the CVD layer 12 does not occur. Due to the fact that the top gate dielectric is a denser oxide than a CVD oxide, the poly reoxidation step does not cause the polysilicon bird's beak to grow beyond a desired size because of the slower diffusion rate of oxidant molecules through the thermal oxide.

Figure 8:
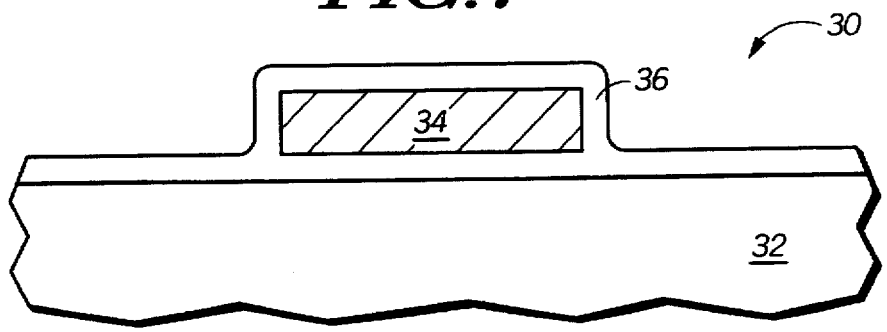
FIGS. 8–11 illustrate, in cross-section, process steps for forming a floating gate in accordance with a second embodiment of the invention.
Figure 9:
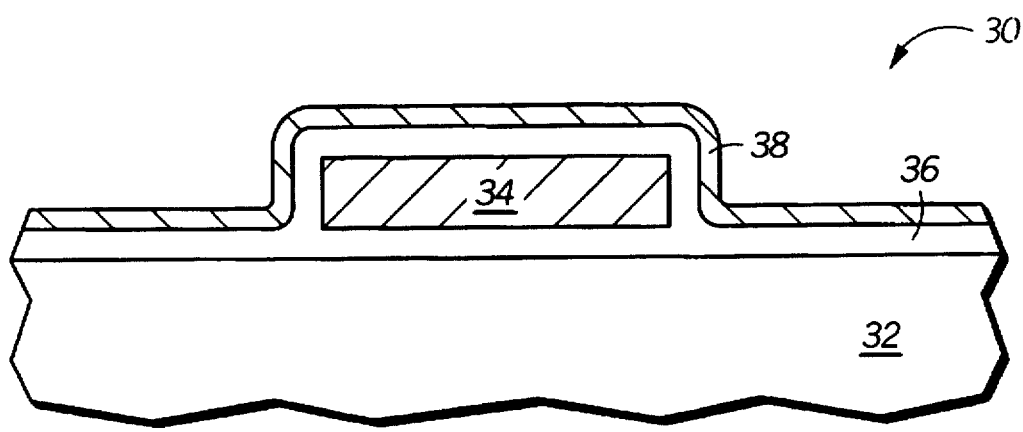
Figure 10:
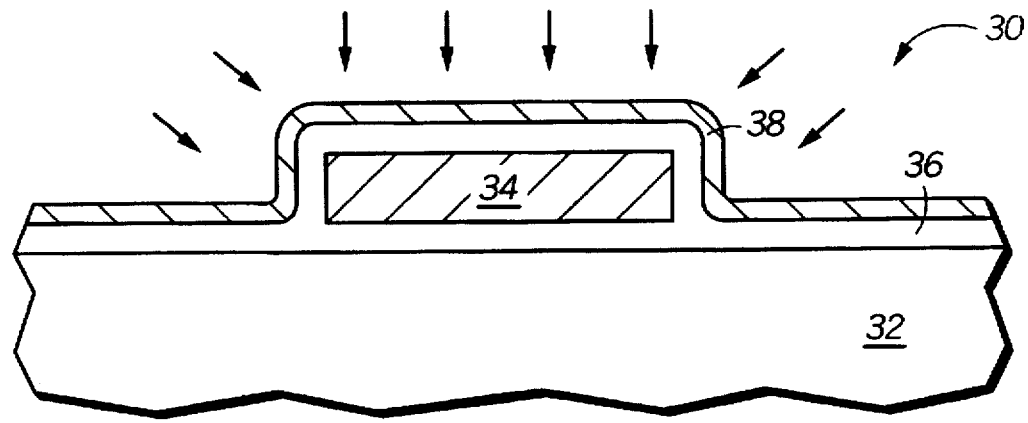
Figure 11:
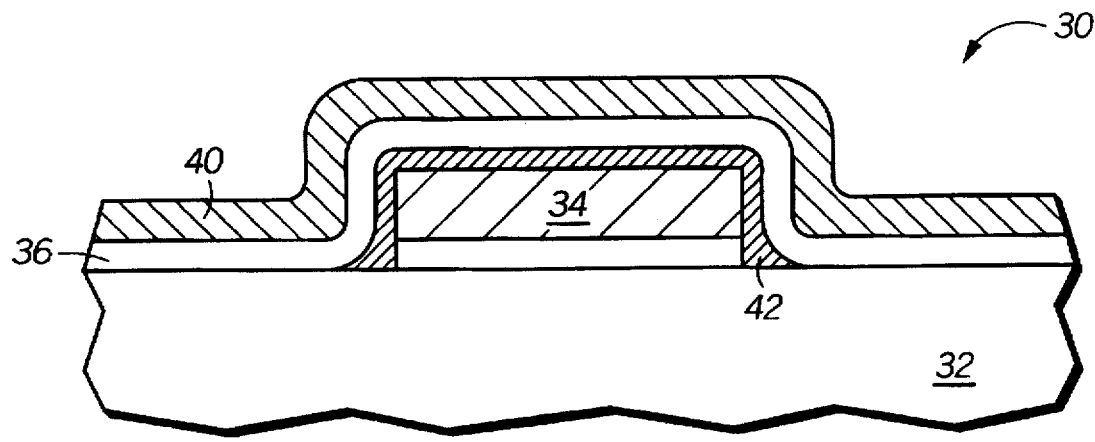

FIGS. 8-10 illustrate, in cross-section, process steps for forming an interpoly dielectric 30 in accordance with the invention. A floating polysilicon layer 34 is provided overlying a first portion of semiconductor substrate 32 as illustrated in FIG. 8. A conformal CVD layer 36 is formed overlying the floating polysilicon 34 and a second portion of the semiconductor substrate 32. The conformal CVD layer 36 should be approximately 50 to 150 Å thick. As mentioned above, the CVD layer may be a TEOS, a LTO, or an HTO or any other suitable CVD material.

In FIG. 9, a silicon layer 38 is deposited overlying the CVD layer 36. Silicon layer 38 may be either amorphous or polycrystalline, approximately 75 to 150 Å thick. Then as shown in FIG. 10, the silicon layer 38 undergoes a thermal oxidation process, wherein either an $O_2$ or $N_2O$ flow is used as the oxidizing agent. The thermal oxidation time should be long enough to convert all of the silicon layer into a thermal oxide layer 40 which is approximately twice the thickness of the deposited silicon layer. Moreover, the thermal oxidation time should also extend long enough for oxidant molecules to diffuse through the less dense underlying CVD layer 36 to oxidize a portion of the underlying floating polysilicon. This over oxidation forms another thermal oxide 42 at the surface of the floating polysilicon to provide a more robust dielectric stack overlying the floating polysilicon 34 to electrically isolate the floating polysilicon. This inner thermal oxide layer 42 should be 20 to 100 Å thick. An advantage to this method over that of the prior art is that the present invention provides a denser top oxide than is possible with a typical ONO stack. Moreover, the top oxide thickness is not limited by kinetics since the silicon layer may be deposited to any desired thickness. The thick top oxide is desirable in the ONO stack to prevent electrons from punching-through the CVO layer 36.

The foregoing description and illustrations contained herein demonstrate many of the advantages associated with the present invention. In particular, it has been revealed that a reverse stacked dielectric may be formed to place the denser thermal oxide on top of the dielectric stack with the less dense dielectric on the bottom of the stack. This method retains the benefits of stacking thermal and CVD oxides. Moreover, the annealing or densification step associated with the prior art method is eliminated by practicing the present invention. Yet another advantage is that the present invention provides a better control of poly bird's beak because oxygen will diffuse through the top thermal oxide relatively slowly to oxidize the polysilicon gate during the polysilicon gate reoxidation process.

Thus it is apparent that there has been provided, in accordance with the invention, a reverse stacked dielectric that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the first dielectric layer 12 may be formed by an oxidation or nitridation of the top surface of the semiconductor substrate instead of being a CVD deposited layer. Also, during the thermal oxidation of the silicon layer, it is possible to add nitrogen trifluoride ($NF_3$) to the oxygen flow such that fluorine will be incorporated into the interface between the silicon substrate and the CVD layer. Alternatively, fluorine may be implanted into the top silicon layer before thermal oxidation. During the oxidation, the fluorine will be driven into the interface. The incorporation of fluorine will reduce the strain at the interface to improve the gate oxide reliability. Therefore, it is intended that this invention encompass all such variations and modifications falling within the scope of the appended claims.

We claim:

1. A method for making a stacked gate dielectric, comprising the steps of:

providing a semiconductor substrate;

forming a CVD oxide layer overlying a portion of the semiconductor substrate;

forming a silicon layer overlying the CVD oxide layer; and oxidizing the silicon layer to convert the silicon layer into a first dielectric layer and to form a second dielectric layer interposed between the CVD oxide layer and the semiconductor substrate, wherein the step of oxidizing also forms a silicon nitride layer interposed between the second dielectric layer and the semiconductor substrate, and the stacked gate dielectric comprises the CVD oxide layer, the first dielectric layer, the second dielectric layer and the nitride layer.

2. A method for forming an interpoly dielectric, comprising the steps of:

providing a semiconductor substrate;

providing a floating polysilicon layer overlying a portion of the semiconductor substrate;

forming a conformal CVD oxide layer overlying the floating polysilicon layer and the semiconductor substrate;

forming a conformal silicon layer abutting the conformal CVD oxide layer wherein a portion of the conformal silicon layer overlies the floating polysilicon layer; and thermally oxidizing the conformal silicon layer to convert the portion of the conformal silicon layer overlying the floating polysilicon layer into a first dielectric layer; and thermally oxidizing a surface of the floating polysilicon layer to convert the surface into a second dielectric layer, wherein the second dielectric layer is disposed between the CVD oxide layer and the floating polysilicon layer, and the interpoly dielectric comprises the conformal CVD oxide layer, the first dielectric layer, and the second dielectric layer.

3. The method of claim 2, wherein the step of forming the conformal silicon layer comprises forming a layer selected from a group of materials consisting of amorphous silicon and polycrystalline silicon.

4. The method of claim 2 wherein the steps of thermally oxidizing the conformal silicon layer and thermally oxidizing the surface of the floating polysilicon layer are performed using a flow of oxidizing gas selected from a group consisting of oxygen and nitrous oxide.

* * * * *